United States Patent [19]

McIntyre et al.

[11] Patent Number: 4,463,368
[45] Date of Patent: Jul. 31, 1984

[54] SILICON AVALANCHE PHOTODIODE WITH LOW $K_{eff}$

[75] Inventors: Robert J. McIntyre, Pointe-Claire; Paul P. Webb, Beaconsfield, both of Canada

[73] Assignee: RCA, Inc., Ste-Anne-de-Bellevue, Canada

[21] Appl. No.: 323,199

[22] Filed: Nov. 20, 1981

[30] Foreign Application Priority Data

Oct. 6, 1981 [CA] Canada ................................. 387432

[51] Int. Cl.³ ............................................. H01L 27/14
[52] U.S. Cl. ...................................... 357/30; 357/13; 357/17
[58] Field of Search ............. 357/30 A, 13, 17, 30 D, 357/30 A, 30 D, 13, 17

[56] References Cited

U.S. PATENT DOCUMENTS

| | | | |
|---|---|---|---|
| 3,886,579 | 5/1975 | Ohuchi et al. | 357/13 |
| 4,127,932 | 12/1978 | Hartman et al. | 29/590 |
| 4,129,878 | 12/1978 | Webb | 357/13 |
| 4,383,267 | 5/1983 | Webb | 357/13 X |

OTHER PUBLICATIONS

Properties of Avalanche Photodiodes by P. P. Webb et al., RCA Review, vol. 35, Jun. 1974, pp. 234–278.
An Optimized Avalanche Photodiode by H. W. Ruegg, IEE Transactions on Electron Devices, vol. ED-14, No. 5, May 1967, pp. 239–251.

Primary Examiner—Andrew J. James
Assistant Examiner—W. Mintel
Attorney, Agent, or Firm—Birgit E. Morris; Donald S. Cohen; William J. Burke

[57] ABSTRACT

An n-p-π-p+Si avalanche photodiode wherein the number of acceptors introduced into a Si body to form the p-type conductivity region has been reduced and this region extends a distance greater than about 35 micrometers into the body from the surface and wherein the n-type conductivity region extends a distance into the body such that the p-n junction is less than about 10 micrometers from the surface of the body. The method of the invention comprises introducing a reduced number of acceptors into the surface of the body, diffusing the acceptors into the body a distance greater than about 35 micrometers and forming an n-type conductivity region such that the p-n junction is less than 10 micrometers from the surface of the device. APDs of the invention exhibit a $k_{eff}$ of about 0.006 which is a factor of greater than 2.5 less than that of typical prior art devices.

5 Claims, 2 Drawing Figures

SILICON AVALANCHE PHOTODIODE WITH LOW $K_{eff}$ The invention relates to an improved avalanche photodiode and, in particular, to an avalanche photodiode having a reduced $k_{eff}$ and a method of making same.

BACKGROUND OF THE INVENTION

An n-p-$\pi$-p$^+$ avalanche photodiode (APD) comprises a body of $\pi$-type conductivity silicon (Si) having an n-type conductivity region extending a distance into the body from a portion of a first surface thereof with a p-type conductivity region extending a further distance into the body from the n-type region, and a p-n junction therebetween. A p$^+$-type conductivity region extends a distance into the body from a surface opposed to the first surface. Electrical contact is made to the n- and p$^+$-type regions.

In the operation of this APD, a reverse bias is applied to the electrical contacts producing an electric field within the APD whose profile depends upon the impurity concentration in the different regions and which forms a depletion region typically reaching through the $\pi$-type region. Light incident on the surface containing the p$^+$-type region enters the photodiode and is absorbed primarily in the $\pi$- or p-type regions, generating electron-hole pairs. The electrons are accelerated by the electric field until they attain sufficient energy for multiplication which typically occurs within one to three micrometers ($\mu$m) of the p-n junction. Holes generated within the high field region are accelerated in the opposite direction and can also undergo multiplication where the electric field is sufficiently high.

One of the limitations of such an APD is that the multiplication process is noisy due to the width of the probability distribution of gains that a carrier can undergo. Webb et al., in RCA Review 35, 234 (1974) disclose that, to a good approximation, the excess noise factor F can be expressed by $$F = k_{eff} <M> + (1 - k_{eff})(2 - 1/<M>)$$

where $k_{eff}$ is a weighted average of the ratio of the hole ionization coefficient to the electron ionization coefficient and $<M>$ is the average avalanche gain. For a Si APD a typical value for $k_{eff}$ is between about 0.015 and about 0.1 and depends strongly upon both the electric field and its profile. To minimize the excess noise, $k_{eff}$ must be as low as possible; i.e., the hole multiplication must be minimized and the electron multiplication must be maximized. Thus the electric field should be large where the electron current is highest and hole current is lowest while the field should be small where the hole current is highest.

It is known that, for a given set of n-type and p-type doses but with varying diffusion parameters, the product $k_{eff} \times V_a \approx 2.35$ for such APDs where $k_{eff} << 1$ and $V_a$ is the voltage drop across the multiplication region when that region is just depleted. If this relationship is valid for higher values of $V_a$, it should be possible to achieve a low $k_{eff}$ merely by choosing diffusion times which would give considerably higher values of $V_a$. It would be desirable, however, and it is an object of this invention, to reduce the value of $k_{eff}$ without increasing the voltage drop $V_a$ as greatly as would appear to be necessary from the disclosure of Conradi et al.

SUMMARY OF THE INVENTION

The invention is an improved n-p-$\pi$-p$^+$ APD having a reduced $k_{eff}$ where the improvement comprises an n-type region extending into the $\pi$-type Si body a distance less than about 10 $\mu$m and a p-type region containing acceptors in an uncompensated excess concentration corresponding to a dose of between about $1 \times 10^{12}$ and about $3 \times 10^{12}$ acceptors/cm$^2$ of the surface area of the body into which the acceptors are introduced and extending into the body a distance greater than about 35 $\mu$m.

The invention also comprises an improved method of making an APD where the improvement comprises forming a p-type region by introducing acceptors into a first surface of a $\pi$-type Si body, diffusing the acceptors a distance into the body greater than about 35 $\mu$m and then diffusing an effective amount of donors a distance into the same surface whereby a p-n junction is formed at a distance less than about 10 $\mu$m from the surface of the body and wherein the p-type region contains an uncompensated excess concentration of acceptors corresponding to a dose of between about 1 and about $3 \times 10^{12}$/cm$^2$ of the portion of the surface area through which the acceptors enter the body.

DETAILED DESCRIPTION OF THE INVENTION

We have found $k_{eff}$ can be significantly reduced in a n-p-$\pi$-p$^+$ Si APD be reducing the total number of acceptors used to form the p-type region and by increasing the diffusion time for the acceptor after implantation by about a factor of four. These changes modify the electric field profile in the multiplication region thereby increasing the electron multiplication region on the p-type side of the p-n junction from between about 1 and 3 $\mu$m to between about 3 and 6 $\mu$m. In order to produce an uncompensated, excess concentration of acceptors corresponding to a total dose of between about 1 and $3 \times 10^{12}$ acceptors/cm$^2$ of the surface area implanted, the n-type region will not be as deep, thereby producing a more abrupt p-n junction. This shallower junction also reduces the width of the n-type region having a high electric field thereby reducing the magnitude of the hole multiplication.

Figure 1:
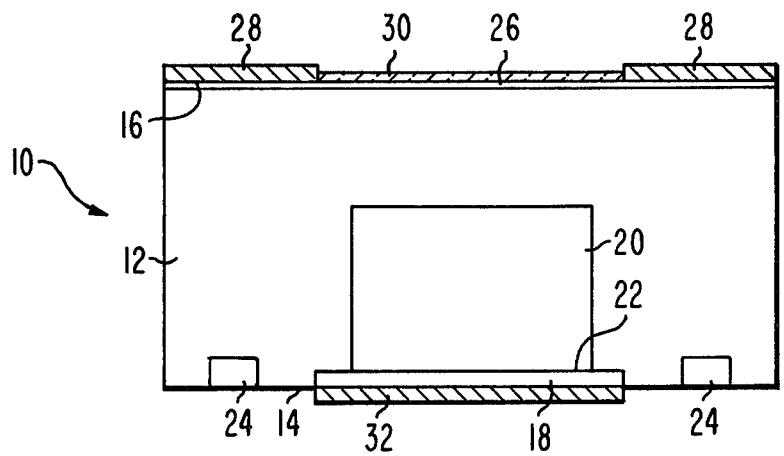
FIGS. 1 and 2 are cross-sectional views of two different embodiments of the improved APD of the invention.

In FIG. 1 the APD 10 includes a body 12 of $\pi$-type conductivity Si having opposed major surfaces 14 and 16. An n-type conductivity region 18 extends a distance into the body 12 from the surface 14 and a p-type conductivity region 20 extends a further distance into the body 12 thereby forming a p-n junction 22 at the intersection of the n- and p-type regions 18 and 20 respectively. A p-type conductivity channel stop 24, containing an excess concentration of acceptors, preferably boron (B), extends a distance of several micrometers or more into the body 12 from the surface 14 and about the perimeter of, but does not contact, the n-type region 18. A p$^+$-type conductivity region 26 extends a distance of about 1 $\mu$m into the opposed surface 16 of the body 12.

An electrical contact 28 overlies a portion of the surface 16 and provides electrical contact to the p$^+$-type region 26. An antireflection coating 30 overlies a portion of the surface 16 through which light enters the body 12. An electrical contact 32 overlies a portion of the surface 14 to provide electrical contact to the n-type region 18.

The APD 10 exhibits a lower $k_{eff}$ but typically requires a reverse bias in excess of 200 volts for full depletion. A significant fraction of this voltage is "wasted" since it does not contribute to the multiplication in the device. The use of a well-type APD reduces the magnitude of this "wasted" voltage since the width of the depletion region can be reduced to between about 10 and 15 $\mu$m. This can be done without affecting the value of $k_{eff}$ since essentially no multiplication occurs in the p-type region 20 more than about 3 or 4 $\mu$m from the p-n junction 22.

Figure 2:
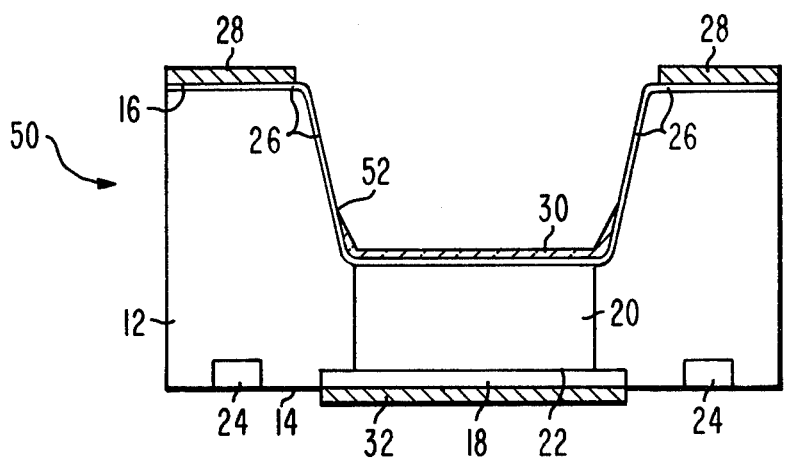

In FIG. 2 the identification of the common elements of the APD 50 and the APD 10 of FIG. 1 is the same. The APD 50 includes a well 52 which extends a distance into the body 12 from the surface 16 towards the p-type region 20. The p+-type region 26 extends into the surface 16 and the surfaces of the well 52. The p-type region 20 preferably extends from the p-n junction 22 up to the p+-type region 26. The antireflection coating 30 overlies the portion of the surface of the well 52 through which light enters the body 12.

The method of making the improved APD 10 or 50 includes the step of preparing a body 12 of $\pi$-type Si, typically having a resistivity of about 5,000 ohm-cm or greater, having two opposed surfaces 14 and 16 which may have any orientation but are preferably (100) crystallographic planes and typically being between about 100 and 125 $\mu$m thick. The p-type region 20 is formed by masking of the surface 14 with a material such as SiO$_2$, and then introducing an acceptor such as boron, preferably by ion implantation, through an opening in the mask in an amount corresponding to between about $3 \times 10^{12}$ and about $8 \times 10^{12}$ acceptors/cm$^2$, and preferably between about $4 \times 10^{12}$ and about $6 \times 10^{12}$ acceptors/cm$^2$ of surface area implanted. The boron is then diffused into the body typically at a temperature between about 1150° C. and 1250° C. for a time such that the p-type region 20 extends into the body 12 a distance greater than about 35 $\mu$m and preferably between about 40 $\mu$m and about 50 $\mu$m. The depth of the p-type region 20 is that depth at which the local concentration of acceptors added is equal to the background concentration of acceptors.

In the completed device about two-thirds of the implanted acceptors remain in the Si body, the remainder being lost to the different oxides and glasses which overlie the first surface during fabrication. The p-type region 20 contains an uncompensated excess concentration of the acceptors corresponding to a dose of between about $1 \times 10^{12}$ and $3 \times 10^{12}$/cm$^2$ of surface area through which the acceptors enter the body.

The n-type region 18 is then formed by introducing a donor, such as phosphorus, arsenic or antimony, into the same surface of the body 12. Typically, the n-type region is formed by suitable masking and prediffusion of phosphorus into the surface from a phosphorus-doped glass (PDG) deposited in an opening in the mask. The glass is then stripped from the surface, the surface recoated with an oxide of Si and the phosphorus diffused into the body a distance such that a p-n junction with the p-type region is formed at a distance less than about 10 $\mu$m, and preferably between about 2 and 5 $\mu$m, from the surface 14. The phosphorus diffusion is typically carried out at 1135° C. for between about 0.5 and about 8 hours.

The p+-type region 26 is typically formed by simultaneous deposition of boron from a boron nitride wafer and diffusion into the body 12 at a temperature of about 1000° C. for about 0.5 hour.

The electrical contact 28 to the p+-type region 26 is typically formed by masking and sequential deposition of Cr and Au layers. The electrical contact 32 to the n-type region 18 is formed by appropriate masking of the surface 14 followed by sequential vacuum deposition of Al, Cr and Au.

The antireflection coating 30 consists of one or more layers of transparent materials having different indices of refraction and is typically formed by deposition of a SiO layer having an optical thickness of $\frac{1}{4}$ of the wavelength of light for which the avalanche photodiode is optimized.

The well 52 in the surface 16 of the photodiode 50 is formed by masking the surface of the body and etching the surface 16 through an opening in the mask to the desired depth using a chemical etch composed of 30 parts of HNO$_3$:2 HF:1 CH$_3$COOH:1 H$_2$O by volume. The well 52 extends into the body 12 a distance such that thickness of the body in the region of the well is about 15 $\mu$m.

APDs were fabricated as described above in a Si substate having a resistivity of 5,000 ohm-cm and a {100} crystallographic surface orientation. The p-type region was formed by ion implantation of boron through a patterned oxide mask to a total dose of $5 \times 10^{12}$ acceptors/cm$^2$ of the surface implanted followed by a diffusion for 256 hours at 1168° C. The p-type region thus formed extended about 48 $\mu$m into the surface of the Si body with a quasi-Gaussian distribution of the boron with distance into this body. Phosphorus was diffused into the same surface from a PDG deposited from the reaction of SiH$_4$ and PH$_3$ at 350° C. followed by a diffusion for 4 hours at 1135° C. to form the n-type region. This produced a p-n junction at a depth of about 5 $\mu$m from the surface. APDs fabricated in this way had a $k_{eff}$ of about 0.006 which is a factor of greater than about 2.5 less than that of typical prior art devices. The product $k_{eff} \times V_a$ for these APDs is about 1.35 which is considerably less than that previously obtained.

We claim:

1. An avalanche photodiode comprising
   a $\pi$-type conductivity silicon body having a pair of opposed major surfaces;
   an n-type conductivity region extending a distance less than about 10 micrometers into the body from a portion of a first major surface thereof;
   a p-type conductivity region contacting the n-type region, containing acceptors in an uncompensated excess concentration corresponding to a dose of between about $1 \times 10^{12}$ and about $3 \times 10^{12}$/cm$^2$ of surface area through which the acceptors enter the body, and extending into the body a distance greater than about 35 micrometers from the first surface;
   a p+-type conductivity region extending a distance into the body from a second major surface opposite to the first surface; and
   first and second electrical contacts overlying portions of the n-type conductivity region and the p+-type conductivity region respectively.

2. The photodiode of claim 1 wherein the n-type conductivity region extends a distance between about 2 and about 5 micrometers into the body.

3. The photodiode of claim 1 wherein the p-type conductivity region extends a distance between about 40 and about 50 micrometers into the body from the first surface.

4. The photodiode of claim 1 wherein the second surface has a well therein extending a distance toward the p-type conductivity region and having a p+-type conductivity region in the surfaces of the well.

5. The photodiode of claim 4 wherein the well extends towards the p-type conductivity region a distance such that the p+-type conductivity region in the surface of the well contacts the p-type conductivity region.

* * * * *